United States Patent
Thompson

(10) Patent No.: US 7,372,279 B2
(45) Date of Patent: May 13, 2008

(54) POWER GENERATION UNIT CONDITION MONITOR USING FREQUENCY PROFILE ANALYSIS

(75) Inventor: Edward D. Thompson, Casselberry, FL (US)

(73) Assignee: Siemens Power Generation, Inc., Orlando, FL (US)

( * ) Notice: Subject to any disclaimer, the term of this patent is extended or adjusted under 35 U.S.C. 154(b) by 0 days.

(21) Appl. No.: 11/140,656

(22) Filed: May 27, 2005

(65) Prior Publication Data

US 2006/0267594 A1  Nov. 30, 2006

(51) Int. Cl.
  G01H 11/06 (2006.01)
  G01N 29/12 (2006.01)
  G01M 1/22 (2006.01)

(52) U.S. Cl. ............ 324/520; 73/660; 73/649; 73/579

(58) Field of Classification Search ........... 324/520
  See application file for complete search history.

(56) References Cited

U.S. PATENT DOCUMENTS

| | | | | |
|---|---|---|---|---|
| 4,078,434 A | * | 3/1978 | Weberhofer | 73/593 |
| 4,321,464 A | * | 3/1982 | Miller | 250/231.1 |
| 4,975,800 A | * | 12/1990 | Oshita et al. | 361/113 |
| 4,977,516 A | * | 12/1990 | Shepherd | 700/279 |
| 5,258,923 A | * | 11/1993 | Imam et al. | 702/36 |
| 5,445,027 A | * | 8/1995 | Zorner | 73/593 |
| 5,526,691 A | | 6/1996 | Latimer et al. | |
| 5,585,565 A | | 12/1996 | Glascock et al. | |
| 6,157,175 A | * | 12/2000 | Morinigo et al. | 322/28 |
| 6,308,787 B1 | * | 10/2001 | Alft | 175/48 |
| 6,487,909 B2 | * | 12/2002 | Harrold et al. | 73/593 |
| 6,539,293 B2 | * | 3/2003 | Bachtiger et al. | 701/20 |
| 6,629,463 B2 | * | 10/2003 | Naudet et al. | 73/579 |
| 6,661,207 B2 | * | 12/2003 | Nelson et al. | 322/29 |
| 6,961,670 B2 | * | 11/2005 | Sasaki et al. | 702/117 |
| 2006/0203801 A1 | * | 9/2006 | Li et al. | 370/352 |

* cited by examiner

Primary Examiner—Andrew H. Hirshfeld
Assistant Examiner—John Zhu

(57) ABSTRACT

A power generator unit condition monitoring system can receive a frequency profile generated by a frequency generating component and can transmit the received frequency to a frequency profile analyzer. The frequency profile analyzer analyzes the transmitted frequency profile and compares the profile against a database. The database can stores normal and abnormal frequency profiles.

18 Claims, 3 Drawing Sheets

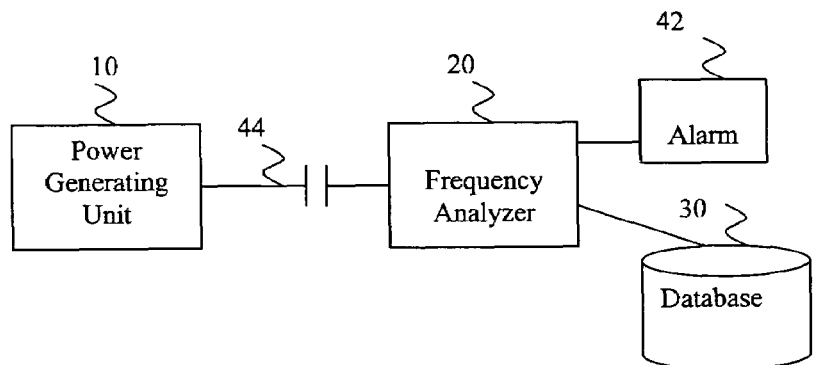

FIGURE 2

| component identifier | frequency sample | frequency disposition | alarm level | action | threshold |
|---|---|---|---|---|---|
| component identifier(1) | frequency sample(1) | normal | none | none | |
| component identifier(2) | frequency sample(2) | normal | none | none | |
| | frequency sample(3) | abnormal | major | turn on light 1 | |
| | frequency sample(4) | abnormal | critical | sound alarm 1 | |
| component identifier(3) | frequency sample(5) | abnormal | major | activate annunciator | |
| . . . | . . . | . . . | . . . | . . . | |
| component identifier(n) | frequency sample(n) | abnormal | minor | send signal | |

FIGURE 3

POWER GENERATION UNIT CONDITION MONITOR USING FREQUENCY PROFILE ANALYSIS

FIELD OF INVENTION

The present invention relates to monitoring a component for faults and, more particularly, to monitoring a generator for faults using frequency profile analysis of the generator components.

BACKGROUND OF THE INVENTION

A generator converts rotational energy into electrical energy. The generator includes a rotor and a stator that surrounds and sleeves the rotor. The rotor has a shaft in which conductive coil windings are axially arranged. One end of the rotor is operatively coupled to a turbine provided to turn the rotor. The other end is operatively coupled to an exciter that provides an electrical current to the rotor coil windings. The rotating electrically charged rotor creates a magnetic flux that induces an electrical current in the stationary stator coil windings. This induced electrical current is then drawn from the stator and constitutes the electricity that the power generation plant provides to electricity consumers.

Occasionally generators have faults related to such things as component wear, stress and/or fatigue, manufacturing defects, human error, and operation problems. Damage to the generator triggered from such a fault can be costly not only for the repair of the unit but also because the generator is no longer producing power. For these reason various methods to detect faults have been established.

One such fault detection method is to have a technician physically walk into the generator housing to visually inspect for faults. This method has several disadvantages. For example, it can only be used when the generator is not operational. Also, this method can only detect faults that have already occurred within the housing. Additionally, this method is susceptible to human error.

Another such method involves inserting a probe into the generator to allow for a visual inspection. However, probes can only be inserted at certain limited locations, which prevent many areas of the generator from being inspected.

Therefore a need remains for an improved way to detect faults in a generator.

SUMMARY OF THE INVENTION

The present invention provides a power generator unit condition monitoring system, comprising a receiver located near a frequency-generating component of a power-generating unit and adapted to generally frequently receive a frequency profile generated by the frequency-generating component, the frequency profile having frequencies selected from the group consisting of sonic, ultrasonic, infrasonic and combinations thereof. The condition monitoring system further comprises a transmission mechanism to generally frequently transmit the received frequency profile and a frequency profile analyzer that analyzes the transmitted frequency profile.

The present invention also provides a frequency profile analyzer for analyzing a frequency profile from a component within a power generation unit, comprising a transmitted frequency profile of the component, a database comprising at least one frequency profile for each of a plurality of components; and a microprocessor adapted to execute a frequency profile analysis software unit that compares the frequency profile to the database frequency profile.

Furthermore, the present invention provides a method for a frequency profile analysis condition monitor, comprising placing a receiver near a frequency-generating component, receiving a frequency profile of the frequency-generating component by the receiver, transmitting the received frequency profile to a frequency profile analyzer; comparing the transmitted frequency profile to a stored frequency profile; and activating an alarm if the comparison indicates a fault.

BRIEF DESCRIPTION OF THE DRAWINGS

The above mentioned and other concepts of the present invention will now be described with reference to the drawings of the exemplary and preferred embodiments of the present invention. The illustrated embodiments are intended to illustrate, but not to limit the invention. The drawings contain the following figures, in which like numbers refer to like parts throughout the description and drawings and wherein:

FIG. 2 is an exemplary schematic diagram of a monitoring system in accordance with the present invention.

FIG. 3 is an exemplary database for storing a plurality of frequency profiles from a plurality of frequency-generating components.

DETAILED DESCRIPTION OF THE INVENTION

Figure 1:
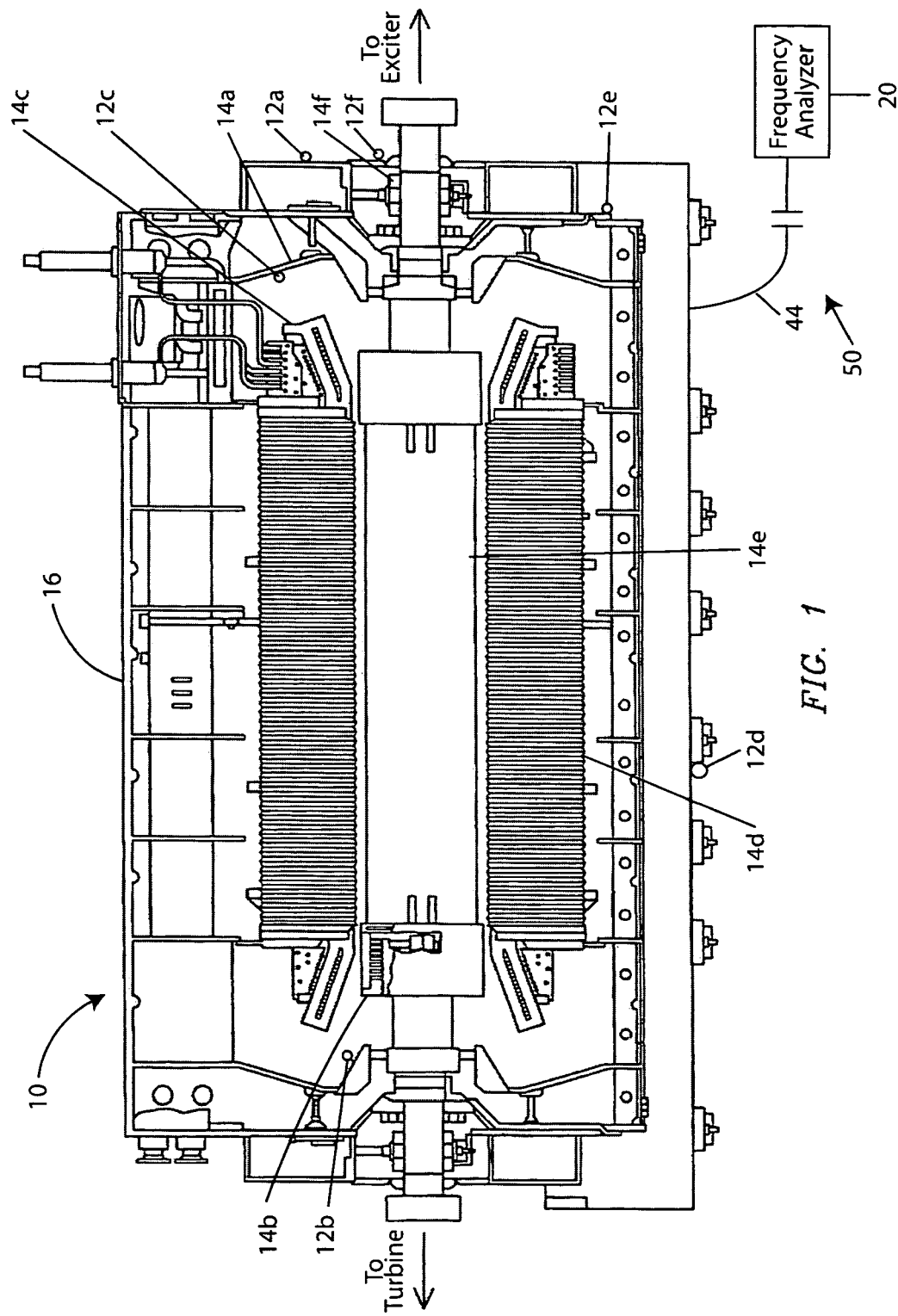
FIG. 1 is a cross section of an exemplary generator having a plurality of frequency profile receivers in accordance with the present invention.
Figure 4:
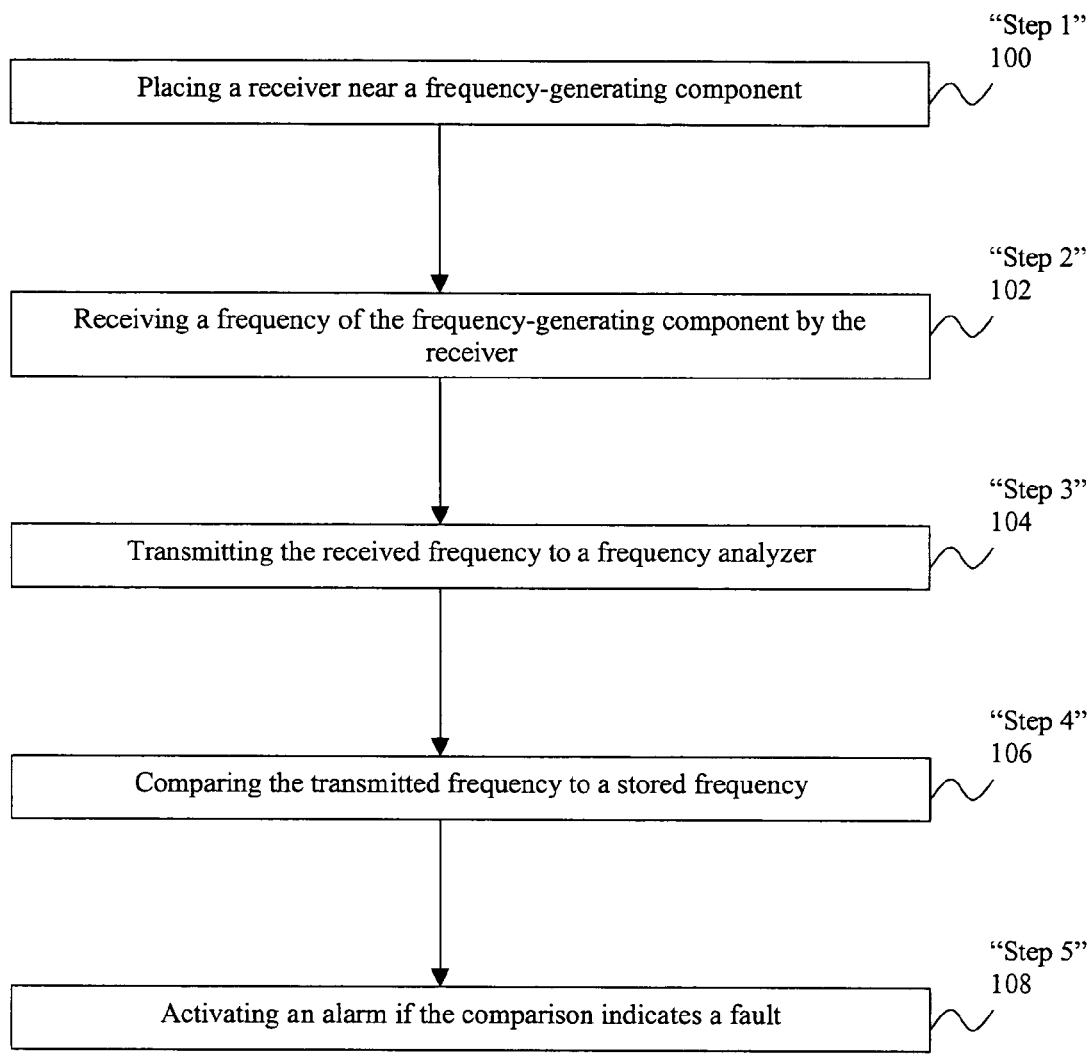
FIG. 4 is a flow chart of an exemplary method for frequency profile analysis condition monitoring in accordance with the present invention.

The monitoring system described herein employs some basic concepts. For example, one concept relates to a receiver 12 for generally frequently receiving a frequency profile from a frequency-generating component 14. Another concept relates to frequently transmitting 44 the received frequency profile to a frequency profile analyzer 20. Another concept relates to a database 30 for storing a normal or abnormal frequency profile of the frequency-generating component 14. Yet another concept relates to a comparison of the transmitted frequency profile 44 with the frequency profile in the database 30 and the comparison for determining if a fault exists.

The present invention is disclosed in context of use of a monitoring system 50 for an electrical generator 10. The principles of the present invention, however, are not limited to the monitoring of generators 10. For example, the monitoring system 50 can be used to monitor devices in other environments such as steam turbines, gas turbines, exciters, and other power generating units. Moreover, the principles of the present invention can be used for non-power generating unit operating devices or environments such as cars, airplanes, condensers, fans or any device capable of generating a frequency profile and which based on that frequency profile an analysis can be performed to determine the condition of the device. One skilled in the art may find additional applications for the apparatus, processes, systems, components, configurations, methods and applications disclosed herein. Thus, the illustration and description of the present invention in context of an exemplary monitoring system 50 for an electrical generator 10 is merely one possible application of the present invention. However, the present invention has particular applicability for electrical generators 10.

Components

Referring to FIGS. 1 and 2, an exemplary monitoring system 50 for fault detection of a frequency-generating component 14 within generator 10 is provided. The monitoring system 50 comprises a receiver 12 for receiving a frequency profile from the frequency-generating component 14 and transmitting 44 the frequency profile to a frequency profile analyzer 20. The frequency profile analyzer 20 compares the transmitted frequency profile to frequency profiles stored in the database 30. If the comparison indicates a fault, the frequency profile analyzer 20 may activate an alarm 42.

Referring to FIG. 1, a generator 10 is coupled in axial alignment between a turbine and an exciter. The generator 10 comprises components that generate a frequency profile. Such frequency-generating components 14 include a baffle 14a, a blower blade 14b, a stator end winding 14c, a stator 14d, a rotor 14e, rotor bearing 14f, and the like. The frequency-generating components 14 typically generate a frequency profile during normal operation of the generator 10, during a fault condition or during both situations. For example, a baffle 14a might typically generate a normal frequency profile under a non-fault condition, but if the baffle 14a became loose it could start to rattle and produce an abnormal frequency profile. For another example, a blower blade 14b could generate one frequency profile under normal operation and a different frequency profile under a fault condition such as a chipped or misaligned blade. The generated frequency profile may be due to vibration of the component 14, such as in the above two examples, or due to other phenomenon that interact with the component 14 such as gas leakage, or an electrical discharge.

The frequency profile includes a waveform (i.e. at least a portion of a sound wave) and may be in an analog and/or digital format. Additionally, the waveform included in the frequency profile may be a mathematically transformed waveform using a mathematical algorithm such as a Fourier transform.

Still referring to FIG. 1, a receiver 12, such as an accelerometer or acoustic transducer, receives frequency profiles from the frequency-generating component 14. The receiver 12 advantageously is adapted to receive frequency profiles having frequencies in the sonic and ultrasonic ranges since most frequency-generating components 14 tend to generate frequencies in these ranges. However, the receiver 12 may also be adapted to receive frequency profiles having frequencies in the subsonic range also. The sonic range is defined as frequencies between 20 Hz and 20 kHz; the subsonic range is defined as the frequencies below the sonic range and the ultra sonic is defined as the frequencies above the sonic range.

The receiver 12 advantageously is located near the frequency-generating component 14 in order to receive a suitably strong signal of the frequency profile. For example, as illustrated in FIG. 1, the receiver 12b is located near the blower blade 14b. Additionally the receiver may be located either inside or outside the generator 10 frame 16, both locations having advantages and disadvantages as explained in more detail below.

One advantage of having the receiver 12 located within the generator 10 is that it may be closer to the frequency-generating component 14, such as the baffle 14a; therefore, a strong signal is received. Disadvantages include difficulty of maintaining the receiver 12 including moving, or replacing the receiver. Furthermore, the receiver 12 should be physically secured such that it will not break free of its mounting during operation of the generator 10. Also, the receiver 12 should be adapted to withstand the environment inside of the generator 10. Environment conditions to consider include but are not limited to temperatures up to or in excess of 100 degree Celsius, hydrogen rich environment, and high magnetic field. Additionally, a directional receiver can be more successfully used when there is no interfering component such as the generator frame 16.

One advantage of having the receiver 12 located outside the generator 10 is that the receiver is more accessible thus facilitating easier maintenance. Moreover, the mounting, which may be on or near the frame 16, may be temporary, thus allowing easier adjustment of the receiver 12 locations. A disadvantage is that the frame 16 may degrade signal strength; therefore considerations such as the thickness and material of the frame 16 should be taken into account when determining a location for the receiver 12.

The receiver 12 is advantageously adapted to continuously receive the frequency profile from the frequency-generating component 14. Continuous receipt provides more frequent data, which may facilitate a quicker identification of a fault. However, the receiver 12 may be adapted to frequently or generally frequently receive the frequency profile. As used herein, the term "generally frequently" means receiving/and or transmitting at least once every day for at least 50% of the generating unit 10 operation days, "frequently" means receiving/and or transmitting at least once every hour for at least 80% of the generating unit 10 operation days, "continuously" means receiving/and or transmitting at least once every 10 seconds for at least 98% of the generating unit 10 operation days.

Still referring to FIG. 1, a transmission link 44 transmits the received frequency profile to a frequency profile analyzer 20 either directly or indirectly. The transmission link may be any suitable wireless, wireline, electrical, and/or optical based system that supports communication between devices. If the transmission link indirectly transmits the received frequency profile, an intermediate device (not shown), for example, a temporary or permanent frequency profile storage device such as tape recorder or hard drive may be used. The frequency profile storage device advantageously allows storage of the frequency profiles for later comparison or analysis.

A frequency profile analyzer 20 analyzes the frequency profile by comparing the transmitted frequency profile with a database frequency profile to determine if a fault has occurred. The frequency profile analyzer 20 may also update the database frequency profile using all or part of the transmitted frequency profile.

The frequency profile analyzer 20 may be co-located with the generator 10 to centralize the location of the condition monitoring equipment. Although the frequency profile analyzer 20 can also be located remotely from the generator 10, for example, in a separate building, state or country than where the generator 10 is housed. The frequency profile analyzer 20 may also receive transmissions from more than one generator 10.

A Central Processing Unit (CPU) may be included as part of the frequency profile analyzer 20 to execute a software unit of the frequency profile analyzer 20. A software unit may be any software code adapted to execute on the CPU, for example, a module, method, thread, or stand alone executable.

Referring now to FIG. 2, a database 30 is accessible to the frequency profile analyzer 20. Accessible refers to any direct or indirect, bi-directional or unidirectional communication between two or more elements in the condition monitor 50, whether or not those elements are in physical contact with one another. The database 30 includes data used to analyze the frequency profile transmitted to the frequency analyzer 20 to determine a fault condition.

Still referring to FIG. 2, the embodiment may include an alarm 42 that is accessible to the frequency profile analyzer 20. The alarm 42 is preferably a sensory device that indicates a fault has occurred. A sensory device includes human perceived senses such as sound as well as computer perceived senses such as a signal. For example, the sensory device may be an audible alarm, a telephone call with a pre-recorded message, a visual light display, annunciator, signal to a computer, and the like. Also, the alarm may include different levels of importance such as minor, major, and critical. Additionally, there may be separate alarms 42 based on failure type and/or the frequency-generating component 14 (FIG. 1) and/or alarm level.

Referring to FIGS. 1 and 3, an exemplary database 30 for organizing and storing a collection of frequency profiles is provided. Many suitable types of database 30 exist such as flat file, relational, extensible markup language (XML), and the like. Any appropriate database type may be used to access the stored data. Considerations such as size and the number of frequency profiles preferably should be taken into account when selecting the database type. The illustrated exemplary database 30 includes a frequency sample 122, a component identifier 120, a frequency profile disposition 124 and an alarm level 126. A frequency sample 122 contains a frequency profile as described above for a frequency-generating component 14.

It is advantageous to store a component identifier 120 to help identify the frequency-generating component 14 for one or more frequency sample 122. This may reduce the number of comparisons by the frequency profile analyzer 20 by preferably comparing only frequency profiles for a specific frequency-generating component identified by the component identifier 120 to the transmitted frequency profile. Additionally, the same frequency profile may be a fault for one frequency-generating component 14 and normal for another, thus the use of component identifier 120 reduces ambiguity.

It is also advantageous to store a frequency profile disposition 124 indicative of if a frequency profile sample 122 is normal or abnormal. "normal" typically would represent a frequency profile under a non-fault condition of the frequency-generating component 14 whereas "abnormal" typically would represent a frequency profile under a fault condition of the frequency-generating component 14. Use of the frequency profile disposition 124 provides flexibility in storing the frequency profile sample 122. For example, for one frequency-generating component 14 a specific fault would generate a known frequency profile stored in the database 30; however, for a different frequency-generating component 14 only a normal frequency profile is stored into the database 30.

An alarm level 126 indicating the importance of the fault, as described above, may also be stored in the database 30. No alarm, or an alarm level 126 such as "none" could be used for a normal frequency profile sample 122. The alarm level 126 may be useful for the frequency profile analyzer 20 to process faults. For example, for a critical alarm level the frequency profile analyzer 20 may shut down the generator 10 as well as indicate an alarm 42.

An alarm action 128 advantageously supplies to the frequency profile analyzer 20 the desired action to occur for a particular fault, which provides the ability to have separate actions for each fault. However, the actions may be duplicated within alarm action 130.

A tolerance range 130 advantageously provides a frequency profile range wherein the transmitted frequency profile can be compared to the frequency profile sample 122 as a range versus a specific frequency profile. For example, a frequency-generating component 14 may have a range of normal frequency profiles. It may be impractical and difficult to store each of these frequency profiles. Likewise, for example, a fault may be detected within a range of an abnormal frequency profile. Therefore a range of frequency profiles may be provided via the tolerance range 130 field. This field may be represented in any suitable way to facilitate providing a range of frequency profiles.

Although FIG. 3 illustrates the alarm level 126, the alarm action 128 and the tolerance range 130 stored on a per frequency profile basis, other suitable configurations, such as per component identifier 120, or per generator 10 (FIG. 1) may be used. Additionally, these fields may be stored on a system level; however, this may reduce the flexibility of these assignments.

Method of Operation

Referring to FIGS. 1, 2, 3 and 4, a flow chart of an example method for a frequency profile analysis condition monitor 50 according to one aspect of the present invention is provided. In "step 1" 100, a receiver 12 is placed near a frequency-generating component 14 as described above. In "step 2" 102 of the method, a frequency profile of the frequency-generating component 14 is received by the receiver 12. "In step 3" 104, the received frequency profile is transmitted to a frequency profile analyzer 20.

In "step 4" 106, the transmitted frequency profile is compared to a frequency sample 122. However, those skilled in the art would recognize other comparison schemes would be suitable for different database configurations.

In one embodiment the transmitted frequency profile is compared with a normal frequency profile for the component identifier 120. Alternatively, the transmitted frequency profile may be compared to the abnormal frequency profiles to establish more information about the fault.

If the frequency profile analyzer 20 can determine the frequency-generating component 14 that generated the frequency profile then the transmitted frequency profile is preferably compared with only the frequency profile samples 122 for that component 14 to possibly reduce the number of comparisons. If however, the frequency profile analyzer 20 cannot determine the frequency-generating component 14, the comparison may produce ambiguous results.

The comparison of the frequency profile may be a direct comparison of all or part of the transmitted frequency profile to all or part of the frequency sample 122. The comparison may involve mathematical conversions of the transmitted frequency profile and/or frequency sample 122 such as Fourier transform. A mathematical analysis may also be done on the transmitted frequency profile and/or frequency sample 122 such as determining the area under the curve. A phase shift of the transmitted frequency profile may also be analyzed.

In the step 5 of the method, activating an alarm if the comparison indicates a fault. Once the fault has been determined an action must be decided. The action may be looked up in the database 30 or decided any other suitable way. Once the action is decided the frequency profile analyzer 20 may activate the alarm 42.

Additionally, once the fault has been determined, the frequency profile analyzer 20 may deactivate the generator 10 or the frequency-generating component 14.

While the preferred embodiments of the present invention have been shown and described herein, it will be obvious that such embodiments are provided by way of example only. Numerous variations, changes and substitutions will occur to those of skill in the art without departing from the invention herein. Also, one or more aspects or features of one or more embodiments or examples of the present invention may be used or combined with one or more other embodiments or examples of the present invention. Accordingly, it is intended that the invention be limited only by the spirit and scope of the appended claims.

I claim:

1. A method for frequency profile analysis condition monitoring of a power generating unit, comprising:

placing a receiver near a frequency-generating component of the power generating unit, the frequency-generating component designed to be stationary during operation of the power generating unit and producing a frequency profile due to an abnormal movement of the frequency-generating component;

receiving by the receiver the frequency profile;

transmitting the received frequency profile to a frequency profile analyzer;

comparing the transmitted frequency profile to a frequency sample stored in a database accessible by the analyzer; and activating an alarm if the comparison indicates a fault for the frequency-generating component, wherein the frequency sample is an abnormal frequency profile, and wherein the database includes a first component identifier associated with a first frequency sample and a second component identifier associated with a second frequency sample, wherein the comparison only compares the transmitted frequency profile with a frequency sample associated to the frequency-generating component by using the component identifier.

2. The method of claim 1, wherein the frequency-generating component is selected from the group consisting of baffle, stator end winding, stator, and gas seal.

3. The method of claim 1, wherein the receiver is securely mounted inside the power generating unit near the frequency-generating component and is adapted to withstand an environment inside the power generating unit.

4. The method of claim 1, wherein the receiver is placed on or near a frame of the power generating unit near the frequency-generating component.

5. The method of claim 1, wherein the receiver is adapted to frequently or continuously receive the frequency profile.

6. The method of claim 1, wherein the received frequency profile is sent directly or indirectly to the frequency profile analyzer.

7. The method of claim 1, wherein the received frequency profile is sent to the frequency profile analyzer in either an analog or a digital format.

8. The method of claim 1, wherein the transmitted frequency pro file and/or frequency sample is mathematically transformed.

9. The method of claim 1, wherein the alarm is selected from the group consisting of a visual alarm, audible alarm, computer signal, and combinations thereof.

10. The method of claim 1, wherein the frequency sample is associated with an alarm level selected from the groups consisting of minor major and critical.

11. The method of claim 10, wherein an alarm action is based on the alarm level.

12. The method of claim 11, wherein an alarm action is based on a fault type.

13. The method of claim 1, wherein the component or the power generating unit is automatically shut down in response to the comparison indicating the fault.

14. The method of claim 1, wherein the frequency sample is associated with a with a tolerance range, which is used in the comparison to determine the fault.

15. The method of claim 1, wherein the power generating unit is a generator having a rotor and a stator that surrounds and sleeves the rotor.

16. A method for a generator frequency profile analysis condition monitoring, comprising:

providing the generator having:
 a rotor,
 a stator that surrounds and sleeves the rotor, and
 a stationary-frequency-generating component that produces a frequency profile due to an abnormal movement by the frequency-generating component;

placing a receiver near the component;

receiving the frequency profile by the receiver;

transmitting the received frequency profile to a frequency profile analyzer;

comparing the transmitted frequency profile to a frequency sample stored in a database accessible by the analyzer; and activating an alarm if the comparison indicates a fault for the component, wherein the database includes a first component identifier associated with a first frequency sample and a second component identifier associated with a second frequency sample, wherein the comparison only compares the transmitted frequency profile with a frequency sample associated to the frequency-generating component by using the component identifier.

17. The method of claim 16, wherein the frequency sample is an abnormal frequency profile.

18. The method of claim 16, wherein the frequency profile analyzer is in a building separate from where the generator is housed.

* * * * *